(12) United States Patent
Vaschenko

(10) Patent No.: US 8,319,201 B2
(45) Date of Patent: Nov. 27, 2012

(54) LASER PRODUCED PLASMA EUV LIGHT SOURCE HAVING A DROPLET STREAM PRODUCED USING A MODULATED DISTURBANCE WAVE

(75) Inventor: Georgiy O. Vaschenko, San Diego, CA (US)

(73) Assignee: Cymer, Inc., San Diego, CA (US)

( * ) Notice: Subject to any disclaimer, the term of this patent is extended or adjusted under 35 U.S.C. 154(b) by 0 days.

(21) Appl. No.: 12/932,067

(22) Filed: Feb. 17, 2011

(65) Prior Publication Data

US 2011/0233429 A1     Sep. 29, 2011

Related U.S. Application Data

(63) Continuation of application No. 11/827,803, filed on Jul. 13, 2007, now Pat. No. 7,897,947.

(51) Int. Cl.
*H05G 1/00* (2006.01)
(52) U.S. Cl. .................... 250/504 R; 250/493.1
(58) Field of Classification Search ........................ None
See application file for complete search history.

(56) References Cited

U.S. PATENT DOCUMENTS

| | | | |
|---|---|---|---|
| 4,426,031 A | 1/1984 | Halasz | 228/121 |
| 4,828,886 A | 5/1989 | Hieber | 427/422 |
| 4,834,637 A | 5/1989 | Conta et al. | 425/110 |
| 5,171,360 A | 12/1992 | Orme et al. | 75/331 |
| 5,226,948 A | 7/1993 | Orme et al. | 75/331 |
| 5,259,593 A * | 11/1993 | Orme et al. | 266/78 |
| 5,340,090 A | 8/1994 | Orme et al. | 266/202 |
| 6,549,551 B2 | 4/2003 | Ness et al. | 372/38.07 |
| 6,567,450 B2 | 5/2003 | Myers et al. | 372/55 |
| 6,625,191 B2 | 9/2003 | Knowles et al. | 372/55 |
| 6,693,939 B2 | 2/2004 | Klene et al. | 372/58 |
| 6,855,943 B2 | 2/2005 | Shields | 250/504 R |
| 6,928,093 B2 | 8/2005 | Webb et al. | 372/25 |
| 7,173,267 B2 * | 2/2007 | Nakano | 250/504 R |
| 7,482,609 B2 * | 1/2009 | Ershov et al. | 250/504 R |
| 7,843,632 B2 * | 11/2010 | Bowering | 359/359 |
| 2003/0223542 A1 * | 12/2003 | Shields | 378/119 |

(Continued)

FOREIGN PATENT DOCUMENTS

JP    2004-111907 A    4/2004

(Continued)

OTHER PUBLICATIONS

Orme & Muntz, "New technique for producing highly uniform droplet streams over an extended range of disturbance wavenumbers," Rev. Sci. instrum. 58 (2), Feb. 1987, pp. 279-284.

(Continued)

*Primary Examiner* — David A Vanore
*Assistant Examiner* — Andrew Smyth
(74) *Attorney, Agent, or Firm* — Cymer, Inc.

(57) ABSTRACT

A plasma generating system is disclosed having a source of target material droplets, e.g. tin droplets, and a laser, e.g. a pulsed $CO_2$ laser, producing a beam irradiating the droplets at an irradiation region, the plasma producing EUV radiation. For the device, the droplet source may comprise a fluid exiting an orifice and a sub-system producing a disturbance in the fluid which generates droplets having differing initial velocities causing at least some adjacent droplet pairs to coalesce together prior to reaching the irradiation region. In one implementation, the disturbance may comprise a frequency modulated disturbance waveform and in another implementation, the disturbance may comprise an amplitude modulated disturbance waveform.

26 Claims, 6 Drawing Sheets

U.S. PATENT DOCUMENTS

| | | | |
|---|---|---|---|
| 2003/0223546 A1* | 12/2003 | McGregor et al. | 378/143 |
| 2005/0259709 A1 | 11/2005 | Das et al. | 372/55 |
| 2006/0176925 A1* | 8/2006 | Nakano | 372/69 |
| 2006/0192153 A1* | 8/2006 | Bykanov et al. | 250/503.1 |
| 2006/0192154 A1* | 8/2006 | Algots et al. | 250/504 R |
| 2006/0219957 A1 | 10/2006 | Ershov et al. | 250/504 R |
| 2006/0249699 A1* | 11/2006 | Bowering et al. | 250/504 R |
| 2006/0255298 A1* | 11/2006 | Bykanov et al. | 250/504 R |
| 2007/0001130 A1* | 1/2007 | Bykanov et al. | 250/493.1 |
| 2007/0001131 A1 | 1/2007 | Ershov et al. | 250/503.1 |
| 2007/0237192 A1 | 10/2007 | Das et al. | 372/25 |
| 2007/0291350 A1 | 12/2007 | Ershov et al. | 359/333 |
| 2008/0043321 A1 | 2/2008 | Bowering et al. | 359/359 |
| 2008/0048133 A1 | 2/2008 | Bykanov et al. | 250/504 R |
| 2008/0087847 A1 | 4/2008 | Bykanov et al. | 250/504 R |
| 2008/0239269 A1* | 10/2008 | LaFontaine et al. | 355/67 |

FOREIGN PATENT DOCUMENTS

| | | |
|---|---|---|
| TW | 200613706 A | 5/2006 |
| TW | I260842 | 8/2006 |
| TW | I276270 | 3/2007 |

OTHER PUBLICATIONS

Brenn & Lackermeire, "Drop formation from a vibrating orifice generator driven by modulated electrical signals," Phys. Fluids 9 (12), Dec. 1997, pp. 3658-3669.

Orme & Muntz, "The manipulation of capillary stream breakup using amplitude-modulated disturbances: A pictorial and quantitative representation," Phys. Fluids A 2 (7), Jul. 1990, pp. 1124-1140.

Orme, "On the genesis of droplet stream microspeed dispersions," Phys. Fluids A 3 (12), Dec. 1991, pp. 2936-2947.

Orme, Willis & Nguyen, "Droplet patterns from capillary stream breakup," Phys. Fluids A 5 (1), Jan. 1993, pp. 80-90.

English Translation of Search Report of TW Patent Application No. 97122840, dated Dec. 8, 2011.

* cited by examiner

LASER PRODUCED PLASMA EUV LIGHT SOURCE HAVING A DROPLET STREAM PRODUCED USING A MODULATED DISTURBANCE WAVE

CROSS-REFERENCE TO RELATED APPLICATIONS

The present application is a continuation of U.S. patent application Ser. No. 11/827,803, filed on Jul. 13, 2007, and published on Jan. 15, 2009, as U.S. 2009/0014668A1, entitled LASER PRODUCED PLASMA EUV LIGHT SOURCE HAVING A DROPLET STREAM PRODUCED USING A MODULATED DISTURBANCE WAVE; the contents of which are incorporated herein by reference.

The present application is related to U.S. patent application Ser. No. 11/358,988 filed on Feb. 21, 2006, published on Nov. 16, 2006, as U.S. 2006/0255298A1, entitled LASER PRODUCED PLASMA EUV LIGHT SOURCE WITH PREPULSE; U.S. patent application Ser. No. 11/067,124 filed on Feb. 25, 2005, now U.S. Pat. No. 7,405,416, issued on Jul. 29, 2008, entitled METHOD AND APPARATUS FOR EUV PLASMA SOURCE TARGET DELIVERY; U.S. patent application Ser. No. 11/174,443 filed on Jun. 29, 2005, now U.S. Pat. No. 7,372,056, issued on May 13, 2008, entitled LPP EUV PLASMA SOURCE MATERIAL TARGET DELIVERY SYSTEM; U.S. patent application Ser. No. 11/358,983 filed on Feb. 21, 2006, now U.S. Pat. No. 7,378,673, issued on May 27, 2008, entitled SOURCE MATERIAL DISPENSER FOR EUV LIGHT SOURCE; U.S. patent application Ser. No. 11/358,992 filed on Feb. 21, 2006, now U.S. Pat. No. 7,598,509, issued on Oct. 6, 2009, entitled LASER PRODUCED PLASMA EUV LIGHT SOURCE; U.S. patent application Ser. No. 11/174,299 filed on Jun. 29, 2005, now U.S. Pat. No. 7,439,530, issued on Oct. 21, 2008, entitled, LPP EUV LIGHT SOURCE DRIVE LASER SYSTEM; U.S. patent application Ser. No. 11/406,216 filed on Apr. 17, 2006, now U.S. Pat. No. 7,465,946, issued on Dec. 16, 2008, entitled ALTERNATIVE FUELS FOR EUV LIGHT SOURCE; U.S. patent application Ser. No. 11/580,414 filed on Oct. 13, 2006, now U.S. Pat. No. 7,491,954, issued on Feb. 17, 2009, entitled, DRIVE LASER DELIVERY SYSTEMS FOR EUV LIGHT SOURCE, and U.S. patent application Ser. No. 11/644,153 filed on Dec. 22, 2006, published on Jun. 26, 2008, as U.S. 2008/0149862A1, entitled LASER PRODUCED PLASMA EUV LIGHT SOURCE; U.S. patent application Ser. No. 11/505,177, filed on Aug. 16, 2006, published on Feb. 21, 2008, as U.S. 2008/0043321A1, entitled EUV OPTICS; U.S. patent application Ser. No. 11/452,558 filed on Jun. 14, 2006, now U.S. Pat. No. 7,518,787, issued on Apr. 14, 2009, entitled DRIVE LASER FOR EUV LIGHT SOURCE; U.S. Pat. No. 6,928,093, issued to Webb, et al., on Aug. 9, 2005, entitled LONG DELAY AND HIGH TIS PULSE STRETCHER; U.S. application Ser. No. 11/394,512, filed on Mar. 31, 2006, now U.S. Pat. No. 7,415,056, issued on Aug. 19, 2008, entitled CONFOCAL PULSE STRETCHER; U.S. application Ser. No. 11/138,001 filed on May 26, 2005, published on Nov. 24, 2005, as U.S. 2005/0259709A1, entitled SYSTEMS AND METHODS FOR IMPLEMENTING AN INTERACTION BETWEEN A LASER SHAPED AS A LINE BEAM AND A FILM DEPOSITED ON A SUBSTRATE; and U.S. application Ser. No. 10/141,216, filed on May 7, 2002, now U.S. Pat. No. 6,693,939, issued on Feb. 17, 2004, entitled, LASER LITHOGRAPHY LIGHT SOURCE WITH BEAM DELIVERY; U.S. Pat. No. 6,625,191 issued to Knowles, et al., on Sep. 23, 2003, entitled VERY NARROW BAND, TWO CHAMBER, HIGH REP RATE GAS DISCHARGE LASER SYSTEM, U.S. application Ser. No. 10/012,002; U.S. Pat. No. 6,549,551 issued to Ness, et al., on Apr. 15, 2003, entitled INJECTION SEEDED LASER WITH PRECISE TIMING CONTROL, U.S. application Ser. No. 09/848,043; and U.S. Pat. No. 6,567,450 issued to Myers, et al., on May 20, 2003, entitled VERY NARROW BAND, TWO CHAMBER, HIGH REP RATE GAS DISCHARGE LASER SYSTEM, U.S. application Ser. No. 09/943,343; U.S. patent application Ser. No. 11/509,925 filed on Aug. 25, 2006, now U.S. Pat. No. 7,476,886, issued on Jan. 13, 2009, entitled SOURCE MATERIAL COLLECTION UNIT FOR A LASER PRODUCED PLASMA EUV LIGHT SOURCE, the entire contents of each of which are hereby incorporated by reference herein.

FIELD

The present disclosure relates to extreme ultraviolet ("EUV") light sources that provide EUV light from a plasma that is created from a target material and collected and directed to an intermediate region for utilization outside of the EUV light source chamber, e.g. by a lithography scanner/stepper.

BACKGROUND

Extreme ultraviolet light, e.g., electromagnetic radiation having wavelengths of around 50 nm or less (also sometimes referred to as soft x-rays), and including light at a wavelength of about 13.5 nm, can be used in photolithography processes to produce extremely small features in substrates, e.g., silicon wafers.

Methods to produce EUV light include, but are not necessarily limited to, converting a material into a plasma state that has at least one element, e.g., xenon, lithium or tin, with one or more emission line in the EUV range. In one such method, often termed laser produced plasma ("LPP") the required plasma can be produced by irradiating a target material having the required line-emitting element, with a laser beam.

One particular LPP technique involves irradiating a target material droplet with one or more pre-pulse(s) followed by a main pulse. In this regard, $CO_2$ lasers may present certain advantages as a drive laser producing "main" pulses in an LPP process. This may be especially true for certain target materials such as molten tin droplets. For example, one advantage may include the ability to produce a relatively high conversion efficiency e.g., the ratio of output EUV in-band power to drive laser input power.

In more theoretical terms, LPP light sources generate EUV radiation by depositing laser energy into a source element, such as xenon (Xe), tin (Sn) or lithium (Li), creating a highly ionized plasma with electron temperatures of several 10's of eV. The energetic radiation generated during de-excitation and recombination of these ions is emitted from the plasma in all directions. In one common arrangement, a near-normal-incidence mirror (often termed a "collector mirror") is positioned at a distance from the plasma to collect, direct (and in some arrangements, focus) the light to an intermediate location, e.g., focal point. The collected light may then be relayed from the intermediate location to a set of scanner optics and ultimately to a wafer. In more quantitative terms, one arrangement that is currently being developed with the goal of producing about 100 W at the intermediate location contemplates the use of a pulsed, focused 10-12 kW $CO_2$ drive laser which is synchronized with a droplet generator to sequentially irradiate about 40,000-100,000 tin droplets per second. For this purpose, there is a need to produce a stable stream of droplets at a relatively high repetition rate (e.g. 40-100 kHz or more) and deliver the droplets to an irradiation site with high accuracy and good repeatability in terms of timing and position (i.e. with very small "jitter") over relatively long periods of time.

For a typical LPP setup, target material droplets are generated and then travel within a vacuum chamber to an irradiation site where they are irradiated, e.g. by a focused laser beam. In addition to generating EUV radiation, these plasma processes also typically generate undesirable by-products in the plasma chamber (e.g. debris) that can potentially damage or reduce the operational efficiency of the various plasma chamber optical elements. These debris can include high-energy ions and scattered debris from the plasma formation, e.g., atoms and/or clumps/microdroplets of is source material. For this reason, it is often desirable to use so-called "mass limited" droplets of source material to reduce or eliminate the formation of debris. The use of "mass limited" droplets also may result in a reduction in source material consumption. Techniques to achieve a mass-limited droplet may involve diluting the source material and/or using relatively small droplets. For example, the use of droplets as small as 10-50 µm is currently contemplated.

In addition to their effect on optical elements in the vacuum chamber, the plasma by-products may also adversely affect the droplet(s) approaching the irradiation site (i.e. subsequent droplets in the droplet stream). In some cases, interactions between droplets and the plasma by-products may result in a lower EUV output for these droplets. In this regard, U.S. Pat. No. 6,855,943 (hereinafter the '943 patent) which issued to Shields on Feb. 15, 2005 and is entitled "DROPLET TARGET DELIVERY METHOD FOR HIGH PULSE-RATE LASER-PLASMA EXTREME ULTRAVIOLET LIGHT SOURCE" discloses a technique in which only some of the droplets in a droplet stream, e.g., every third droplet, is irradiated to produce a pulsed EUV light output. As disclosed in the '943 patent, the nonparticipating droplets (so-called buffer droplets) advantageously shield the next participating droplet from the effects of the plasma generated at the irradiation site. However, the use of buffer droplets may increase source material consumption and/or vacuum chamber contamination and/or may require droplet generation at a frequency much higher (e.g. by a factor of two or more) than required without the use of buffer droplets. On the other hand, if the spacing between droplets can be increased, the use of buffer droplets may be reduced or eliminated. Thus, droplet size, spacing and timing consistency (i.e. jitter) tend to be on the top of the list of factors to be considered when designing a droplet generator for an LPP EUV light source.

One technique for generating droplets involves melting a target material, e.g. tin, and then forcing it under high pressure through a relative small diameter orifice, e.g. 5-30 µm. Under most conditions, naturally occurring instabilities, e.g. noise, in the stream exiting the orifice may cause the stream to break up into droplets. In order to synchronize the droplets with optical pulses of the LPP drive laser, a repetitive disturbance with an amplitude exceeding that of the random noise may be applied to the continuous stream. By applying a disturbance at the same frequency (or its higher harmonics) as the repetition rate of the pulsed laser, the droplets can be synchronized with the laser pulses. In the past, the disturbance has typically been applied to the stream by driving an electro-actuatable element (such as a piezoelectric material) with a waveform of a single frequency such as a sinusoidal waveform, triangular waveform, square waveform or their equivalent.

As used herein, the term "electro-actuatable element" and its derivatives, means a material or structure which undergoes a dimensional change when subjected to a voltage, electric field, magnetic field, or combinations thereof and includes but is not limited to piezoelectric materials, electrostrictive materials and magnetostrictive materials.

In general, for the application of single frequency, non-modulated waveform disturbances, the spacing between droplets increases as the disturbance frequency decreases (i.e. holding other factors such as pressure and orifice diameter constant). However, as disclosed in "Drop Formation From A Vibrating Orifice Generator Driven By Modulated Electrical Signals" (G. Brenn and U. Lackermeier, Phys. Fluids 9, 3658 (1997) the contents of which are incorporated by reference herein), for disturbance frequencies below about $0.3v/(\pi d)$, where v is the stream velocity and d is the diameter of the continuous liquid stream, more than one droplet may be generated for each disturbance period. Thus, for 10 µm liquid jet at a stream velocity of about 50 m/s, the calculated frequency minimum below which more than one drop per period may be produced is about 480 kHz (note: it/is currently envisioned that a droplet repetition rate of 40-100 kHz and velocities of about 30-50 m/s may be desirable for LPP EUV processes). The net result is that is for the application of single frequency, non-modulated waveform disturbances, the spacing between droplets is fundamentally limited and cannot exceed approximately 3.33 $\pi d$. As indicated above, it may be desirable to supply a sufficient distance between adjacent droplets in the droplet stream to reduce/eliminate the effect of the debris from the plasma on approaching droplet(s). Moreover, because the limitation on spacing is proportional to stream diameter, and as a consequence droplet size, this limitation can be particularly severe in applications such as LPP EUV light sources where relatively small, mass-limited, droplets are desirable (see discussion above).

With the above in mind, Applicants disclose a laser produced plasma, EUV light source having a droplet stream produced using a modulated disturbance waveform, and corresponding methods of use.

SUMMARY

In one aspect, a device is disclosed which may comprise a plasma generating system having a source of target material droplets, e.g. tin, and a laser, e.g. pulsed $CO_2$ laser, producing a beam irradiating the droplets at an irradiation region, the plasma producing EUV radiation. For the device, the droplet source may comprise a fluid exiting an orifice and a sub-system producing a disturbance in the fluid which generates droplets having differing initial velocities causing at least some adjacent droplet pairs to coalesce together prior to reaching the irradiation region.

For this aspect, the ratio of initial droplets to coalesced droplets may be two, three, four or more and in some cases ten or more. In one embodiment, the subsystem may comprise a signal generator and an electro-actuatable element, e.g. at least one piezoelectric crystal, and in a particular embodiment, the sub-system may comprise a capillary tube and is the disturbance may be created in the fluid by vibrating, e.g. squeezing, the capillary tube. In one implementation, the disturbance may comprise a frequency modulated disturbance waveform and in another implementation, the disturbance may comprise an amplitude modulated disturbance waveform.

In an implementation of this aspect, the disturbance may comprise a carrier wave having a carrier wave frequency and a modulation wave having a frequency comprising a carrier wave frequency subharmonic. In a particular implementation of this aspect, the laser may be a pulsed laser having a pulse repetition rate and the disturbance may comprise a modulated disturbance waveform having a modulation frequency equal to the pulse repetition rate.

In another aspect, a device is disclosed which may include a plasma generating system comprising a source of target material droplets and a laser producing a beam irradiating the droplets at an irradiation region, the plasma producing EUV radiation. For this aspect, the droplet source may comprise a fluid exiting an orifice and a sub-system producing a disturbance in the fluid, the disturbance comprising at least two characteristic frequencies.

In a further aspect, a device is disclosed which may include a means for forcing a fluid through an orifice, a means operable on the fluid to generate a first droplet and a second droplet, the first droplet having a different initial velocity than the second droplet causing the first and second droplet to coalesce together prior to reaching an irradiation region, and a means for irradiating the droplets at the irradiation region to form a plasma. In one implementation, the means operable on the fluid may generate a third droplet having an initial velocity to cause the first, second and third droplets to coalesce together prior to reaching the irradiation region. In one embodiment, the means operable on the fluid may comprise one electro-actuable element and in another embodiment, the means operable on the fluid may comprise a plurality of electro-actuable elements.

DETAILED DESCRIPTION

Figure 1:
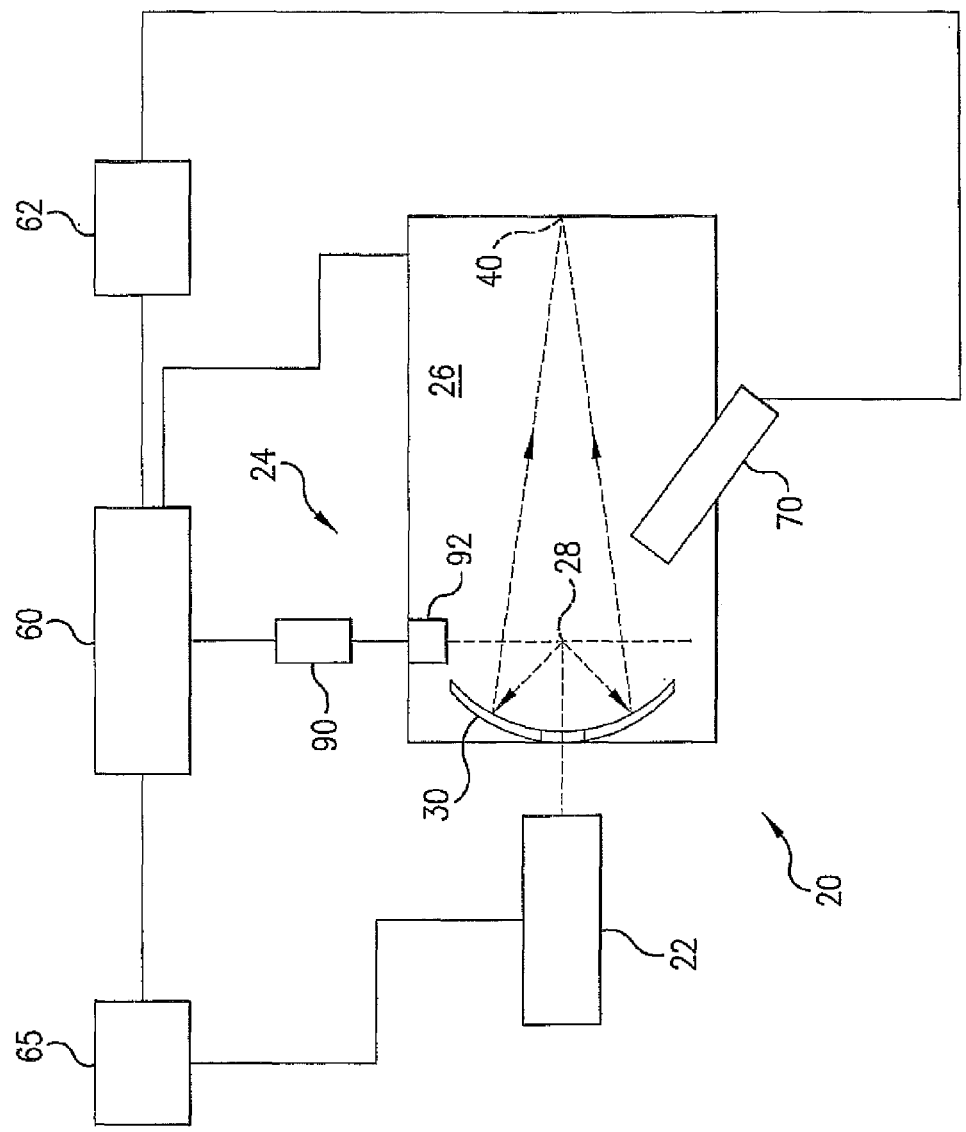
FIG. 1 shows a simplified, schematic view of a laser produced plasma EUV light source.

With initial reference to FIG. 1 there is shown a schematic view of an EUV light source, e.g., a laser-produced-plasma, EUV light source 20 according to one aspect of an embodiment. As shown in FIG. 1, and described in further details below, the LPP light source 20 may include a system 22 for generating a train of light pulses and delivering the light pulses into a chamber 26. As detailed below, each light pulse may travel along a beam path from the system 22 and into the chamber 26 to illuminate a respective target droplet at an irradiation region 28.

Suitable lasers for use as the device 22' shown in FIG. 1 may include a pulsed laser device, e.g., a pulsed gas discharge $CO_2$ laser device producing radiation at 9.3 μm or 10.6 μm, e.g., with DC or RF excitation, operating at relatively high power, e.g., 10 kW or higher and high pulse repetition rate, e.g.; 50 kHz or more. In one particular implementation, the laser may be an axial-flow RF-pumped $CO_2$ having a MOPA configuration with multiple stages of amplification and having a seed pulse that is initiated by a Q-switched Master Oscillator (MO) with low energy and high repetition rate, e.g., capable of 100 kHz operation. From the MO, the laser pulse may then be amplified, shaped, and focused before entering the LPP chamber. Continuously pumped $CO_2$ amplifiers may be used for the system 22'. For example, a suitable $CO_2$ laser device having an oscillator and three amplifiers (O-PA1-PA2-PA3 configuration) is disclosed in U.S. patent application Ser. No. 11/174,299 filed on Jun. 29, 2005, now U.S. Pat. No. 7,439,530, issued on Oct. 21, 2008, and entitled, LPP EUV LIGHT SOURCE DRIVE LASER SYSTEM, the entire contents of which have been previously incorporated by reference herein. Alternatively, the laser may be configured as a so-called "self-targeting" laser system in which the droplet serves as one mirror of the optical cavity. In some "self-targeting" arrangements, a master oscillator may not be required. Self targeting laser systems are disclosed and claimed in U.S. patent application Ser. No. 11/580,414 filed on Oct. 13, 2006, now U.S. Pat. No. 7,491,954, issued on Feb. 17, 2009, entitled, DRIVE LASER DELIVERY SYSTEMS FOR EUV LIGHT SOURCE, the entire contents of which have been previously incorporated by reference herein.

Depending on the application, other types of lasers may also be suitable, e.g., an excimer or molecular fluorine laser operating at high power and high pulse repetition rate. Examples include, a solid state laser, e.g., having a fiber or disk shaped active media, a MOPA configured excimer laser system, e.g., as shown in U.S. Pat. Nos. 6,625,191, 6,549,551, and 6,567,450, an excimer laser having one or more chambers, e.g., an oscillator chamber and one or more amplifying chambers (with the amplifying chambers in parallel or in series), a master oscillator/power oscillator (MOPO) arrangement, a power oscillator/power amplifier (POPA) arrangement, or a solid state laser that seeds one or more excimer or molecular fluorine amplifier or oscillator chambers, may be suitable. Other designs are possible.

As further shown in FIG. 1, the EUV light source 20 may also include a target material delivery system 24, e.g., delivering droplets of a target material into the interior of a chamber 26 to the irradiation region 28 where the droplets will interact with one or more light pulses, e.g., one or more pre-pulses and thereafter one or more main pulses, to ultimately produce a plasma and generate an EUV emission. The target material may include, but is not necessarily limited to, a material that includes tin, lithium, xenon or combinations thereof. The EUV emitting element, e.g., tin, lithium, xenon, etc., may be in the form of liquid droplets and/or solid particles contained within liquid droplets. For example, the element tin may be used as pure tin, as a tin compound, e.g., $SnBr_4$, $SnBr_2$, $SnH_4$, as a tin alloy, e.g., tin-gallium alloys, tin-indium alloys, tin-indium-gallium alloys, or a combination thereof. Depending on the material used, the target material may be presented to the irradiation region 28 at various temperatures including room temperature or near room temperature (e.g., tin alloys, $SnBr_4$) at an elevated temperature, (e.g., pure tin) or at temperatures below room temperature, (e.g., SnH$_4$), and in some cases, can be relatively volatile, e.g., SnBr$_4$. More details concerning the use of these materials in an LPP EUV source is provided in U.S. patent application Ser. No. 11/406,216 filed on Apr. 17, 2006, now U.S. Pat. No. 7,465,946, issued on Dec. 16, 2008, entitled ALTERNATIVE FUELS FOR EUV LIGHT SOURCE, the contents of which have been previously incorporated by reference herein.

Continuing with FIG. 1, the EUV light source 20 may also include an optic 30, e.g., a collector mirror in the form of a truncated ellipsoid having, e.g., a graded multi-layer coating with alternating layers of Molybdenum and Silicon. FIG. 1 shows that the optic 30 may be formed with an aperture to allow the light pulses generated by the system 22 to pass through and reach the irradiation region 28. As shown, the optic 30 may be, e.g., an ellipsoidal mirror that has a first focus within or near the irradiation region 28 and a second focus at a so-called intermediate region 40 where the EUV light may be output from the EUV light source 20 and input to a device utilizing EUV light, e.g., an integrated circuit lithography tool (not shown). It is to be appreciated that other optics may be used in place of the ellipsoidal mirror for collecting and directing light to an intermediate location for subsequent delivery to a device utilizing EUV light, for example the optic may be parabolic or may be configured to deliver a beam having a ring-shaped cross-section to an intermediate location, see e.g. U.S. patent application Ser. No. 11/505,177 filed on Aug. 16, 2006, published on Feb. 21, 2008 as U.S. 2008/0043321A1, entitled EUV OPTICS, the contents of which are hereby incorporated by reference.

Continuing with reference to FIG. 1, the EUV light source 20 may also include an EUV controller 60, which may also include a firing control system 65 for triggering one or more lamps and/or laser devices in the system 22 to thereby generate light pulses for delivery into the chamber 26. The EUV light source 20 may also include a droplet position detection system which may include one or more droplet imagers 70 that provide an output indicative of the position of one or more droplets, e.g., relative to the irradiation region 28. The imager(s) 70 may provide this output to a droplet position detection feedback system 62, which can, e.g., compute a droplet position and trajectory, from which a droplet error can be computed, e.g., on a droplet by droplet basis or on average. The droplet error may then be provided as an input to the controller 60, which can, for example, provide a position, direction and/or timing correction signal to the system 22 to control a source timing circuit and/or to control a beam position and shaping system, e.g., to change the location and/or focal power of the light pulses being delivered to the irradiation region 28 in the chamber 26.

The EUV light source 20 may include one or more EUV metrology instruments for measuring various properties of the EUV light generated by the source 20. These properties may include, for example, intensity (e.g., total intensity or intensity within a particular spectral band), spectral bandwidth, polarization, beam position, pointing, etc. For the EUV light source 20, the instrument(s) may be configured to operate while the downstream tool, e.g., photolithography scanner, is on-line, e.g., by sampling a portion of the EUV output, e.g., using a pickoff mirror or sampling "uncollected" EUV light, and/or may operate while the downstream tool, e.g., photolithography scanner, is off-line, for example, by measuring the entire EUV output of the EUV light source 20.

As further shown in FIG. 1, the EUV light source 20 may include a droplet control system 90, operable in response to a signal (which in some implementations may include the droplet error described above, or some quantity derived therefrom) from the controller 60, to e.g., modify the release point of the target material from a droplet source 92 and/or modify droplet formation timing, to correct for errors in the droplets arriving at the desired irradiation region 28 and/or synchronize the generation of droplets with the pulsed laser system 22.

Figure 2:
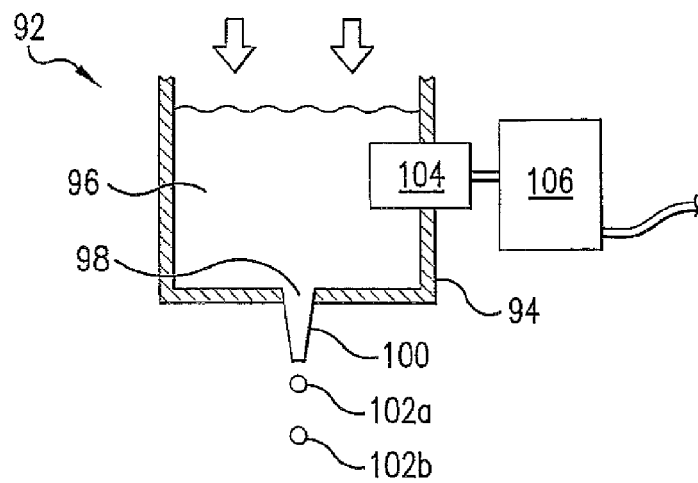
FIG. 2 shows a schematic a simplified droplet source.
Figure 2A:
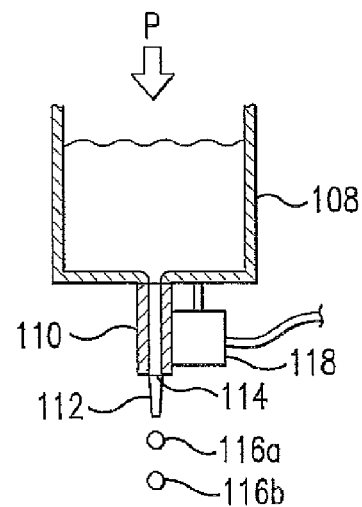
FIGS. 2A-2D illustrate several different techniques for coupling an electro-actuable element with a fluid to create a disturbance in a stream exiting an orifice.

FIG. 2 illustrates the components of a simplified droplet source 92 in schematic format. As shown there, the droplet source 92 may include a reservoir 94 holding a fluid, e.g. molten tin, under pressure. Also shown, the reservoir 94 may be formed with an orifice 98 allowing the pressurized fluid 98 to flow through the orifice establishing a continuous stream 100 which subsequently breaks into a plurality of droplets 102a, b.

Figure 2B:
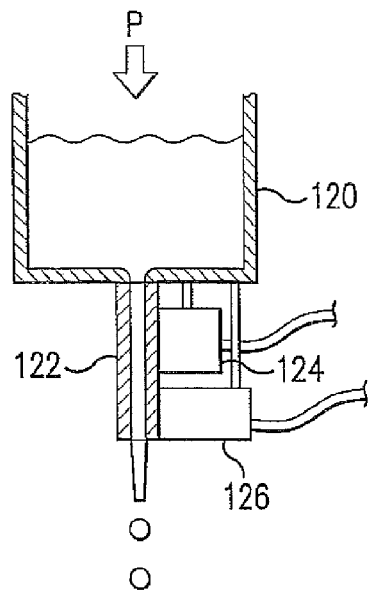
Figure 2C:
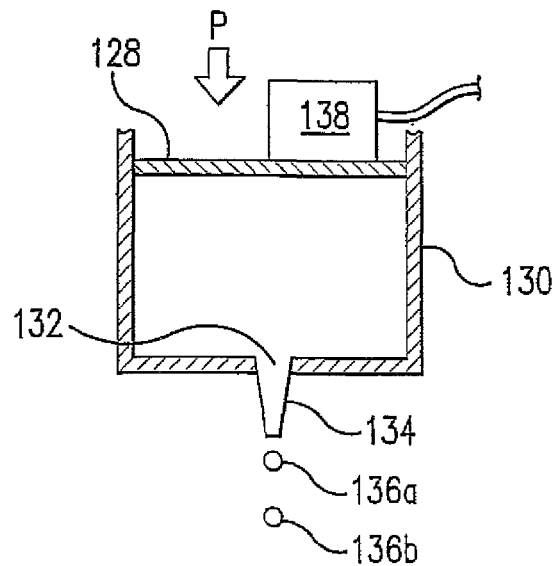
Figure 2D:
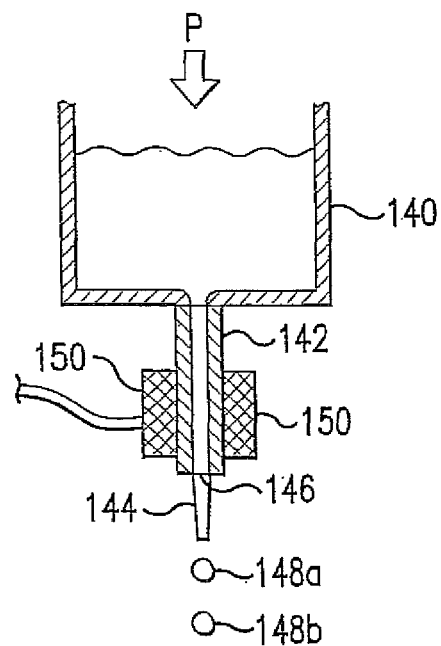

Continuing with FIG. 2, the droplet source 92 shown further includes a sub-system producing a disturbance in the fluid having an electro-actuatable element 104 that is operable coupled with the fluid 98 and a signal generator 106 driving the electro-actuatable element 104. FIGS. 2A-2D show various ways in which one or more electro-actuatable elements may be operable coupled with the fluid to create droplets. Beginning with FIG. 2A, an arrangement is shown in which the fluid is forced to flow from a reservoir 108 under pressure through a tube 110, e.g. capillary tube, having an inside diameter between about 0.5-0.8 mm, and a length of about 10 to 50 mm, creating a continuous stream 112 exiting an orifice 114 of the tube 110 which subsequently breaks up into droplets 116a,b. As shown, an electro-actuatable element 118 may be coupled to the tube For example, an electro-actuatable element may be coupled to the tube 110 to deflect the tube 110 and disturb the stream 112. FIG. 2B shows a similar arrangement having a reservoir 120, tube 122 and a pair of electro-actuatable elements 124, 126, each coupled to the tube 122 to deflect the tube 122 at a respective frequency. FIG. 2C shows another variation in which a plate 128 is positioned in a reservoir 130 moveable to force fluid through an orifice 132 to create a stream 134 which breaks into droplets 136a,b. As shown, a force may be applied to the plate 128 and one or more electro-actuatable elements 138 may be coupled to the plate to disturb the stream 134. It is to be appreciated that a capillary tube may be used with the embodiment shown in FIG. 2C. FIG. 2D shows another variation in which a fluid is forced to flow from a reservoir 140 under pressure through a tube 142 creating a continuous stream 144 exiting an orifice 146 of the tube 142 which subsequently breaks up into droplets 148a,b. As shown, an electro-actuatable element 150, e.g. having a ring-like shape, may be positioned around the tube 142. When driven, the electro-actuatable element 142 may selectively squeeze the tube 142 to disturb the stream 144. It is to be appreciated that two or more electro-actuatable elements may be employed to selectively squeeze the tube 142 at respective frequencies.

More details regarding various droplet dispenser configurations and their relative advantages may be found in U.S. patent application Ser. No. 11/358,988 filed on Feb. 21, 2006, published on Nov. 16, 2006, as U.S. 2006/0255298A1, entitled LASER PRODUCED PLASMA EUV LIGHT SOURCE WITH PRE-PULSE; U.S. patent application Ser. No. 11/067,124 filed on Feb. 25, 2005, now U.S. Pat. No. 7,405,416, issued on Jul. 29, 2008, entitled METHOD AND APPARATUS FOR EUV PLASMA SOURCE TARGET DELIVERY; and U.S. patent application Ser. No. 11/174,443 filed on Jun. 29, 2005, now U.S. Pat. No. 7,372,056, issued on May 13, 2008, entitled LPP EUV PLASMA SOURCE MATERIAL TARGET DELIVERY SYSTEM, the contents of each of which are hereby incorporated by reference.

Figure 3:
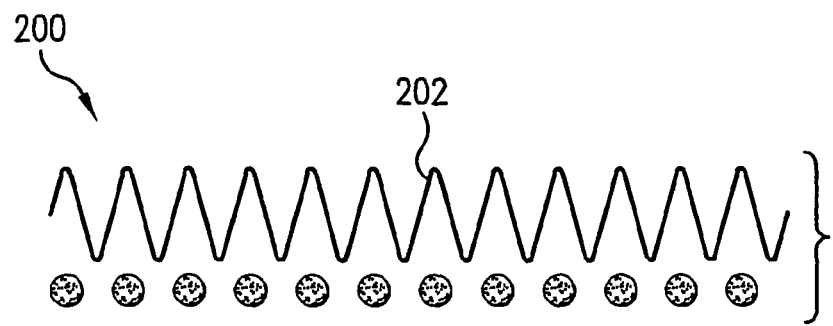
FIG. 3 illustrates the pattern of droplets resulting from a single frequency, non-modulated disturbance waveform.

FIG. 3 illustrates the pattern of droplets 200 resulting from a single frequency, sine wave disturbance waveform 202 (for disturbance frequencies above about 0.3v/(σd)). It can be seen that each period of the disturbance waveform produces a droplet and the resulting droplets are spaced by one disturbance waveform wavelength. FIG. 3 also illustrates that the droplets do not coalesce together, but rather, each droplet is established with the same initial velocity.

Figure 4:
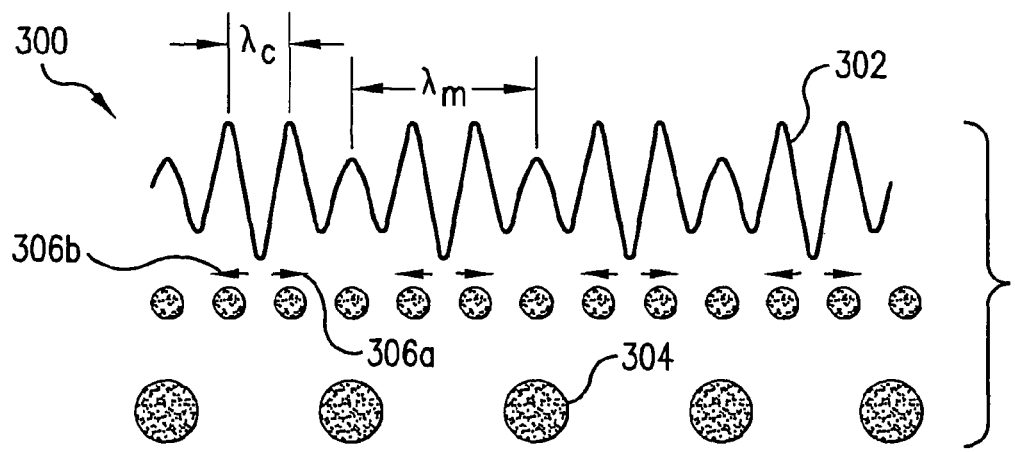
FIG. 4 illustrates the pattern of droplets resulting from an amplitude modulated disturbance waveform.

FIG. 4 illustrates the pattern of droplets 300 initially resulting from an amplitude modulated disturbance waveform 302, which however is unlike the disturbance waveform 202 described above in that it is not limited to disturbance frequencies above about 0.3v/(πd)). It can be seen that the amplitude modulated waveform disturbance 302 includes two characteristic frequencies, a relatively large frequency, e.g. carrier frequency, corresponding to wavelength $\lambda_c$, and a smaller frequency, e.g. modulation frequency, corresponding to wavelength, $\lambda_m$. For the specific disturbance waveform example shown in FIG. 4, the modulation frequency is a carrier frequency subharmonic, and in particular, the modulation frequency is a third of the carrier frequency. With this waveform, FIG. 4 illustrates that each period of the disturbance waveform corresponding to the carrier wavelength, $\lambda_c$ produces a droplet and the resulting droplets are initially spaced by one carrier wavelength, $\lambda_c$. FIG. 4 also illustrates that the droplets coalesce together, resulting in a stream of larger droplets 304, with one larger droplet for each period of the disturbance waveform corresponding to the modulation wavelength, $\lambda_m$. It can also be seen that the resulting coalesced droplets are spaced by one modulation wavelength, $\lambda_m$. Arrows 306a,b show the initial relative velocity components that are imparted on the droplets by the modulated waveform disturbance 302 and are responsible for the droplet coalescence.

Figure 5:
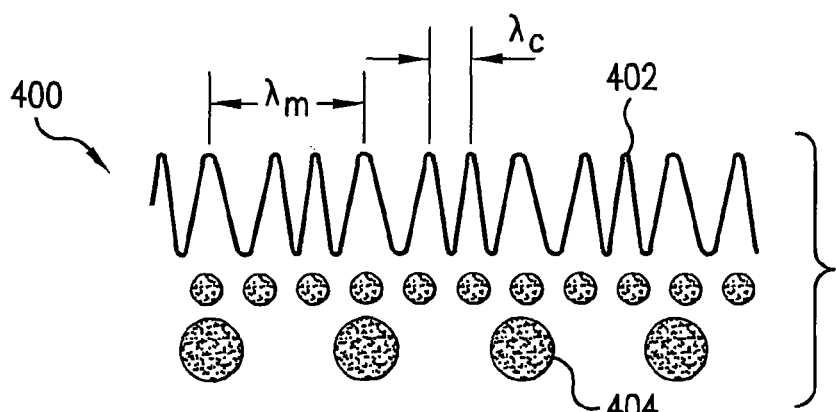
FIG. 5 illustrates the pattern of droplets resulting from a frequency modulated disturbance waveform.

FIG. 5 illustrates the pattern of droplets 400 initially resulting from a frequency modulated disturbance waveform 402, which, like the disturbance waveform 302 described above, is not limited to disturbance frequencies above about 0.3 v/(πd). It can be seen that the frequency modulated waveform disturbance 402 includes two characteristic frequencies, a relatively large frequency, e.g. carrier frequency, corresponding to wavelength $\lambda_c$, and a smaller frequency, e.g. modulation frequency, corresponding to wavelength, $\lambda_m$. For the specific disturbance waveform example shown in FIG. 5, the modulation frequency is a carrier frequency subharmonic, and in particular, the modulation frequency is about a third of the carrier frequency. With this waveform, FIG. 5 illustrates that each period of the disturbance waveform corresponding to the carrier wavelength, $\lambda_c$ produces a droplet and the resulting droplets are initially spaced by one carrier wavelength, $\lambda_m$. FIG. 5 also illustrates that the droplets coalesce together, resulting in a stream of larger droplets 44, with one larger droplet for each period of the disturbance waveform corresponding to the modulation wavelength, $\lambda_m$. It can also be seen that the resulting coalesced droplets are spaced by one modulation wavelength, $\lambda_m$. Like the amplitude modulated disturbance (i.e. FIG. 4), initial relative velocity components are imparted on the droplets by the frequency modulated waveform disturbance 402 and are responsible for the droplet coalescence.

Although FIGS. 4 and 5 show and discuss embodiments having two characteristic frequencies, with FIG. 4 illustrating an amplitude modulated disturbance having two characteristic frequencies and FIG. 5 illustrating a frequency modulated disturbance having two frequencies, it is to be appreciated that more than two characteristic frequencies may be employed and that the modulation may be either angular modulation (i.e. frequency or phase modulation), amplitude modulation or combinations thereof.

Figure 6:
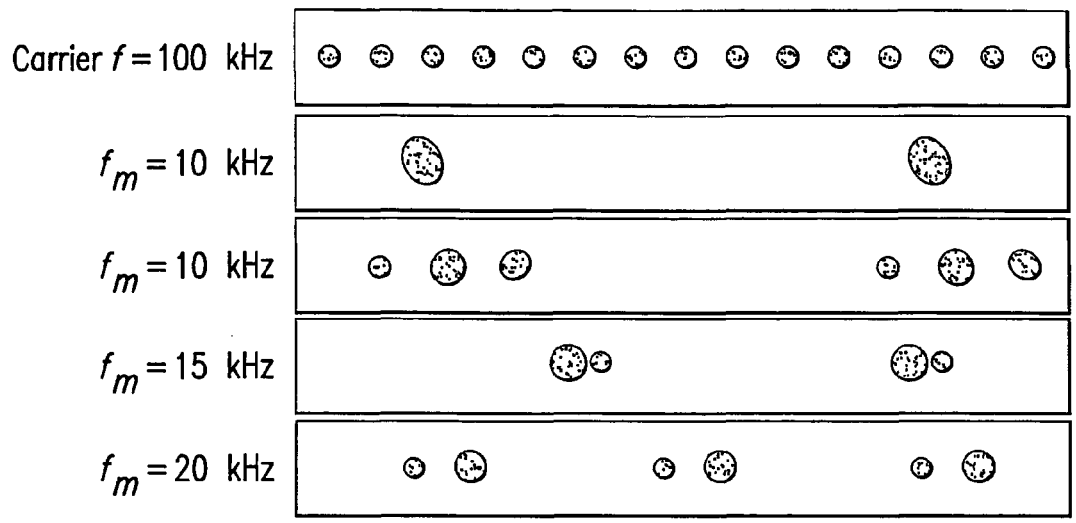
FIG. 6 shows photographs of tin droplets obtained for a single frequency, non-modulated waveform disturbance and several frequency modulated waveform disturbances.

FIG. 6 shows photographs of tin droplets obtained using an apparatus similar to FIG. 2D with an orifice diameter of about 70 μm, stream velocity of ~30 m/s, for a single frequency, non-modulated waveform disturbance having a frequency of 100 kHz (top photo); a frequency modulated waveform disturbance having a carrier frequency of 100 kHz and a modulating frequency of 10 kHz of a relatively strong modulation depth (second from top photo); a frequency modulated waveform disturbance having a carrier frequency of 100 kHz and a modulating frequency of 10 kHz of a relatively weak modulation depth (third from top photo); a frequency modulated waveform disturbance having a carrier frequency of 100 kHz and a modulating frequency of 15 kHz (fourth from top photo) a frequency modulated waveform disturbance having a carrier frequency of 100 kHz and a modulating frequency of 20 kHz (bottom photo).

These photographs indicate that tin droplets having a diameter of about 265 μm can be produced that are spaced apart by about 3.14 mm, a spacing which cannot be realized at this droplet size and repetition rate using a single frequency, non-modulated waveform disturbance.

Measurements conducted using the droplet photos indicated a timing jitter of about 0.14% of a modulation period which is substantially less than the jitter observed under similar conditions using a single frequency, non-modulated waveform disturbance. This effect is achieved by averaging the individual droplets instabilities over a number of coalescing droplets.

Figure 7:
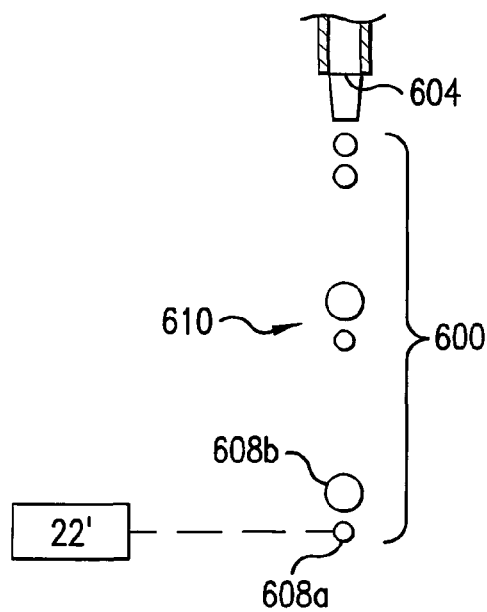
FIG. 7 illustrates a droplet pattern achievable using a modulated waveform disturbance in which droplet pairs reach the irradiation region allowing one droplet to shield subsequent droplet pairs from plasma debris.

FIG. 7 shows a droplet pattern 600 produced using a modulated, e.g. multiple frequency, disturbance waveform (see also FIG. 6 fourth photo from top). As shown, at a selected distance from orifice 604. As shown, this droplet pattern in which droplet pairs reach the irradiation region allows droplet 608a to establish an EUV emitting plasma upon irradiation by the laser 22' while droplet 608b shields subsequent droplet pair 610 from plasma debris.

Figure 8:
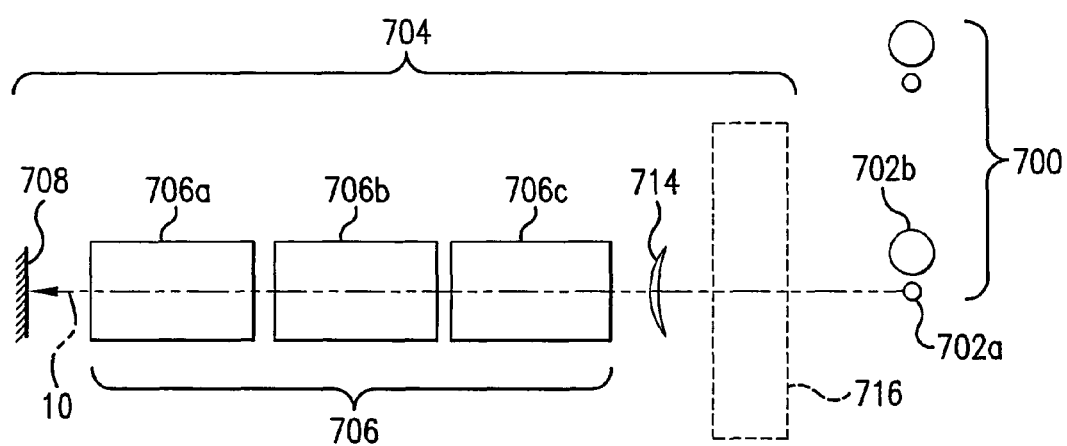
FIG. 8 illustrates a droplet pattern achievable using a modulated waveform disturbance in which droplet pairs reach the irradiation region with a first droplet reflecting light into a self-directing laser system to initiate a discharge which irradiates the second droplet to produce an EUV emitting plasma.

FIG. 8 illustrates a droplet pattern 700 achievable using a modulated e.g. multiple frequency, disturbance waveform in which droplet pairs reach the irradiation region with a first droplet 702a reflecting light into a self-directing laser system 704 to initiate a laser oscillation output laser beam which irradiates the second droplet 702b to produce an EUV emitting plasma.

Self-directing laser system 704 is more fully described in U.S. patent application Ser. No. 11/580,414 filed on Oct. 13, 2006, now U.S. Pat. No. 7,491,954, issued on Feb. 17, 2009, entitled, DRIVE LASER DELIVERY SYSTEMS FOR EUV LIGHT SOURCE, see in particular, FIG. 5, the entire contents of which were previously incorporated by reference. Although the following describes a laser system 704 corresponding to FIG. 5 of the patent application Ser. No. 11/580, 414, it is to be appreciated that this description is equally applicable to the other self-directed lasers disclosed in the patent application Ser. No. 11/580,414 (i.e. FIGS. 6-16.)

Continuing with FIG. 8, it can be seen that the self directing laser system 704 may include an optical amplifier 706a,b,c. For example, the optical amplifier 706 may be a CW pumped, multiple chamber, $CO_2$ laser amplifier amplifying light at a wavelength of 10.6 μm and having a relatively high two-pass gain (e.g. a two pass gain of about 1,000,000). As further shown, the amplifier 706 may include a chain of amplifier chambers 706a-c, arranged in series, each chamber having its own active media and excitation source, e.g. electrodes.

In use, the first droplet 702a of target material is placed on a trajectory passing through or near a beam path 710 extending through the amplifier 706. Spontaneously emitted photons from the amplifier 706 may be scattered by the droplet and some scattered photons may be placed on path 710 where they travel though the amplifier 706. As shown, an optic 708 may be positioned to receive the photons on path 710 from the amplifier 706 and direct the beam back through the amplifier 706 for subsequent interaction with the second droplet 702b to produce an EUV light emitting plasma. For this arrangement, the optic 708 may be, for example, a flat mirror, curved mirror, phase-conjugate mirror or corner reflector. An optical element 714, e.g., lens may be positioned to collimate light entering the amplifier 706 from the droplet and focus light traveling from the amplifier 706 to the droplet. An optional optical delay 716 may be provided to establish the required time delay between when the first and second droplets reach the irradiation region. One advantage of using different droplets to 1) establish the optical oscillator and 2) generate an EUV emitting plasma is that the size of the droplets may be independently optimized for their specific function (i.e. reflection versus plasma production).

While the particular embodiment(s) described and illustrated in this patent application in the detail required to satisfy 35 U.S.C. §112 are fully capable of attaining one or more of the above-described purposes for, problems to be solved by, or any other reasons for or objects of the embodiment(s) above described, it is to be understood by those skilled in the art that the above-described embodiment(s) are merely exemplary, illustrative and representative of the subject matter which is broadly contemplated by the present application. Reference to an element in the following Claims in the singular is not intended to mean nor shall it mean in interpreting such Claim element "one and only one" unless explicitly so stated, but rather "one or more". All structural and functional equivalents to is any of the elements of the above-described embodiment(s) that are known or later come to be known to those of ordinary skill in the art are expressly incorporated herein by reference and are intended to be encompassed by the present Claims. Any term used in the Specification and/or in the Claims and expressly given a meaning in the Specification and/or Claims in the present Application shall have that meaning, regardless of any dictionary or other commonly used meaning for such a term. It is not intended or necessary for a device or method discussed in the Specification as an embodiment to address or solve each and every problem discussed in this application, for it to be encompassed by the present Claims. No element, component, or method step in the present disclosure is intended to be dedicated to the public regardless of whether the element, component, or method step is explicitly recited in the Claims. No claim element in the appended Claims is to be construed under the provisions of 35 U.S.C. §112, sixth paragraph, unless the element is expressly recited using the phrase "means for" or, in the case of a method claim, the element is recited as a "step" instead of an "act".

What is claimed is:

1. A device comprising:
a plasma generating system comprising a source of target material droplets and a laser producing a beam irradiating the droplets at an irradiation region, the plasma producing EUV radiation, wherein the droplet source comprises a fluid exiting an orifice and a sub-system producing a disturbance in the fluid which generates droplets having controlled initial velocities causing at least some adjacent droplet pairs to coalesce together prior to reaching the irradiation region, wherein the sub-system comprises at least two electro-actuatable elements operating at different frequencies.

2. A device as recited in claim 1 wherein the different frequencies cause a ratio of initial droplets to coalesced droplets to be greater than two.

3. A device as recited in claim 1 wherein the disturbance comprises a frequency modulated disturbance waveform.

4. A device as recited in claim 1 wherein the disturbance comprises an amplitude modulated disturbance waveform.

5. A device as recited in claim 1 wherein the target material comprises tin.

6. A device as recited in claim 1 wherein the sub-system comprises a capillary tube and the disturbance is created in the fluid at least partially by squeezing the capillary tube.

7. A device as recited in claim 1 wherein the laser comprises a gain media and the gain media comprises $CO_2$.

8. A device as recited in claim 1 wherein at least one of the plurality of electro-actuatable elements comprises at least one piezoelectric crystal.

9. A device as recited in claim 1 wherein the disturbance comprises a carrier wave having a carrier wave frequency and a modulation wave having a frequency comprising a carrier wave frequency subharmonic.

10. A device as recited in claim 1 wherein the laser is a pulsed laser having a pulse repetition rate and the disturbance comprises a modulated disturbance waveform having a modulated frequency equal to said pulse repetition rate.

11. A device comprising:
means for forcing a fluid through an orifice;
means operable on the fluid to generate a first droplet and a second droplet, the first droplet having a different initial velocity than the second droplet causing the first and second droplet to coalesce together in a controlled manner prior to reaching an irradiation region; and
means for irradiating the droplets at the irradiation region to form a plasma, wherein the means operable on the fluid comprises at least two electro-actuatable elements operating at different frequencies.

12. A device as recited in claim 11 wherein different frequencies causes a third droplet to be generated, the third droplet having an initial velocity such that the first, second and third droplets to coalesce together prior to reaching the irradiation region.

13. A method for generating EUV radiation, comprising:
providing a plasma generating system comprising a source of liquid target material having an orifice and a laser producing a beam irradiating droplets of the liquid target material at an irradiation region;
forcing the liquid target material to exit from the orifice toward the irradiation region; and
disturbing the liquid target material exiting the orifice to produce the droplets, wherein at least two adjacent droplets have different velocities upon exiting the orifice to cause the two adjacent droplets to coalesce prior to reaching the irradiation region, wherein the disturbing is caused by at least two electro-actuatable elements operating at different frequencies.

14. The method of claim 13 wherein the liquid target material is molten tin.

15. The method of claim 13 wherein the disturbing is performed using one of a amplitude-modulated disturbance wave form and a frequency-modulated disturbance wave form.

16. The method of claim 13 wherein a tube is coupled to the orifice and wherein the disturbing is at least partially caused by squeezing the tube.

17. The method of claim 16 wherein the tube is a capillary tube.

18. A device as recited in claim 1 further comprising a tube coupled to the orifice, wherein at least one of the two electro-actuable elements is coupled to the tube to generate at least a portion of the disturbance.

19. A device as recited in claim 1 further comprising a tube coupled to the orifice, wherein the at least two electro-actuable elements are both coupled to the tube to generate at least a portion of the disturbance.

20. A device as recited in claim 1 further comprising a plate, wherein at least one of the two electro-actuable elements is coupled to the plate to generate at least a portion of the disturbance.

21. A device as recited in claim 11 further comprising a tube coupled to the orifice, wherein at least one of the two electro-actuable elements is coupled to the tube.

22. A device as recited in claim 11 further comprising a tube coupled to the orifice, wherein the at least two electro-actuable elements are both coupled to the tube.

23. A device as recited in claim 11 further comprising a plate, wherein at least one of the two electro-actuable elements is coupled to the plate.

24. The method of claim 13 wherein a tube is coupled to the orifice and wherein at least one of the two electro-actuable elements is coupled to the tube to generate at least a portion of the disturbing.

25. The method of claim 13 wherein a tube is coupled to the orifice and wherein the at least two electro-actuable elements are both coupled to the tube to generate at least a portion of the disturbance.

26. A method as recited in claim 13 wherein the plasma generating system further comprising a plate and wherein at least one of the two electro-actuable elements is coupled to the plate to generate at least a portion of the disturbing.

* * * * *